United States Patent [19]

Andersen et. al.

[11] Patent Number: 4,617,728

[45] Date of Patent: Oct. 21, 1986

[54] METHOD AND DEVICE FOR MOUNTING ELECTRONIC COMPONENTS ON A PRINTED CIRCUIT CARD

[75] Inventors: Axel Andersen, Solvcenget; Klaus Bøndergaard, Gentofte, both of Denmark

[73] Assignee: Sincotron APS, Denmark

[21] Appl. No.: 619,201

[22] Filed: Jun. 11, 1984

[30] Foreign Application Priority Data

Jun. 13, 1983 [SE] Sweden .............................. 8303330

[51] Int. Cl.⁴ .......................... H05K 3/30; B23P 19/00
[52] U.S. Cl. ........................................ 29/836; 29/740; 221/211
[58] Field of Search .................. 29/740, 809, 834, 836; 206/329; 221/246, 211; 278/6.2; 294/64.1

[56] References Cited

U.S. PATENT DOCUMENTS

| | | | |
|---|---|---|---|
| 3,958,740 | 5/1976 | Dixon .................... | 228/102 |
| 4,116,348 | 9/1978 | Atchley et al. .................... | 29/240 X |
| 4,127,432 | 11/1978 | Kuwano et al. ................... | 29/740 X |
| 4,135,630 | 1/1979 | Snyder et al. .................. | 294/64.1 X |
| 4,292,116 | 9/1981 | Takahashi et al. ............... | 29/740 X |
| 4,307,832 | 12/1981 | Taki et al. .......................... | 228/6.2 X |
| 4,327,482 | 5/1982 | Araki et al. ........................ | 29/840 X |
| 4,342,090 | 7/1982 | Caccoma et al. ................. | 29/740 X |
| 4,346,514 | 8/1982 | Makizawa et al. ............... | 29/834 X |
| 4,372,802 | 2/1983 | Harigane et al. ................ | 221/211 X |
| 4,381,601 | 5/1983 | Tamai et al. ............................ | 29/740 |
| 4,520,557 | 6/1985 | Harigane et al. ...................... | 29/740 |
| 4,527,324 | 7/1985 | Dean et al. ............................. | 29/564.6 |
| 4,528,747 | 7/1985 | Hoffman et al. ....................... | 29/834 |

FOREIGN PATENT DOCUMENTS

| | | |
|---|---|---|
| 42977 | 1/1982 | European Pat. Off. . |
| 2935081 | 3/1981 | Fed. Rep. of Germany . |
| 2076703 | 12/1981 | United Kingdom . |

OTHER PUBLICATIONS

"Logpoint", brochure.

*Primary Examiner*—Howard N. Goldberg
*Assistant Examiner*—Carl J. Arbes
*Attorney, Agent, or Firm*—Steele, Gould, Fried

[57] ABSTRACT

When mounting pinless electronic components on the conductor path side of a printed circuit card, the components are oriented in a predetermined manner, depending on the desired orientation at the mounting site, in component trays from which the components are transferred to the printed circuit card by means of a manually operated suction device. On the conductor path side of the printed circuit card, an adhesive material has previously been applied to the intended mounting sites of the components, the suction force of the suction device being set at a lower value than the adhesive force of the adhesive material.

In addition to a number of component trays, a mounting table with a rotatable holder for the printed circuit cards, a program-controlled indicator system for indicating the relevant trays and mounting sites, and a suction device for manually transferring the components from the trays to the printed circuit card, the device according to the present invention has been provided with a surface profiling, preferably in the form of grooves, adapted to determine the intended component orientation and to intercept said components. The device also has a movable wrist support ruler for quick and accurate alignment of the components with respect to the intended mounting sites, and in the suction line of the suction device, a pressure sensing element may be provided for sensing when a component has been placed on the printed circuit card.

8 Claims, 15 Drawing Figures

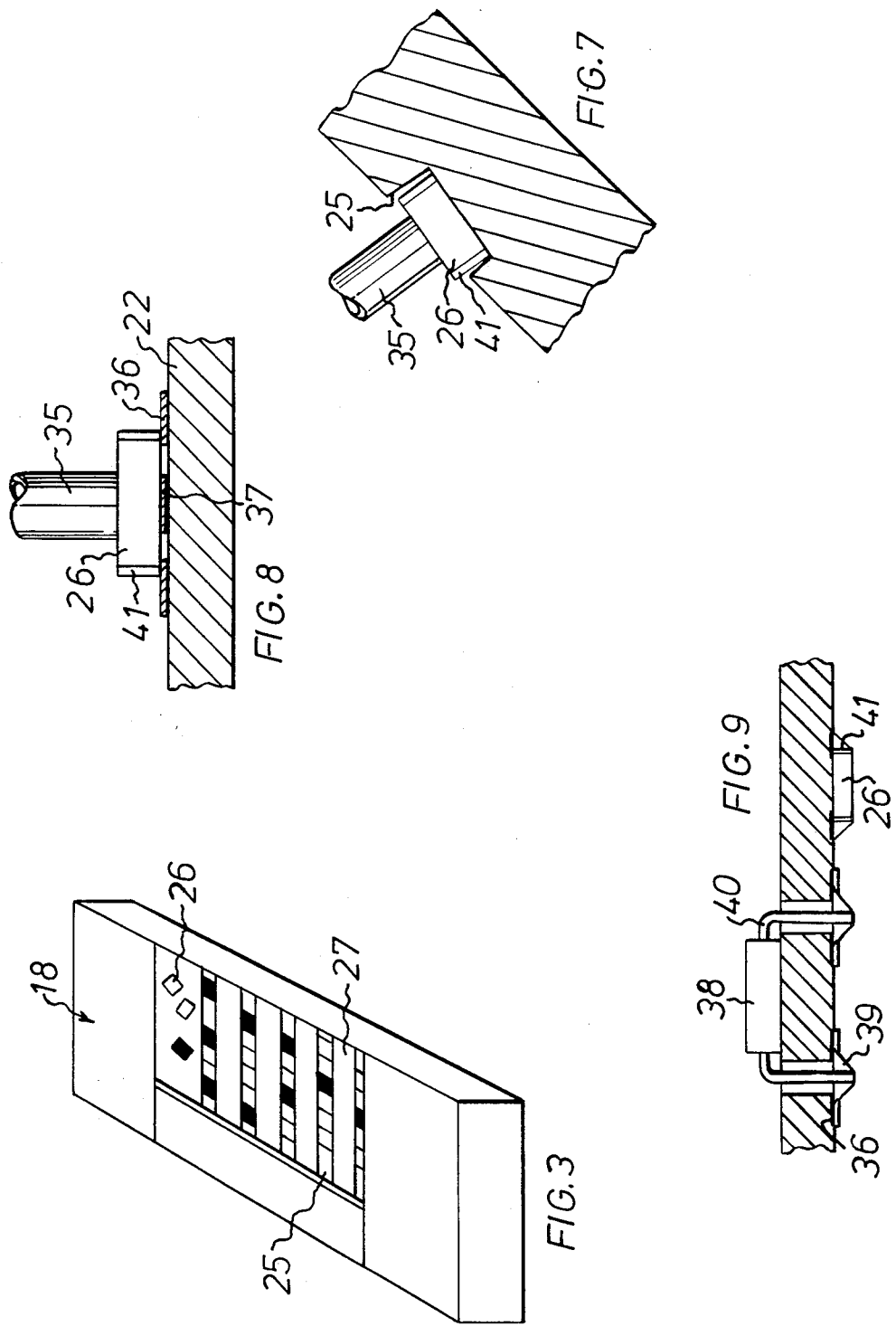

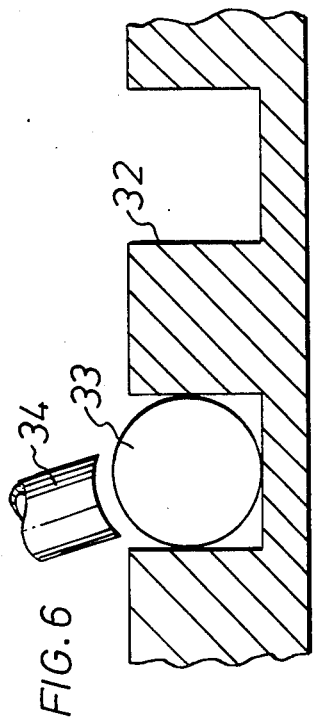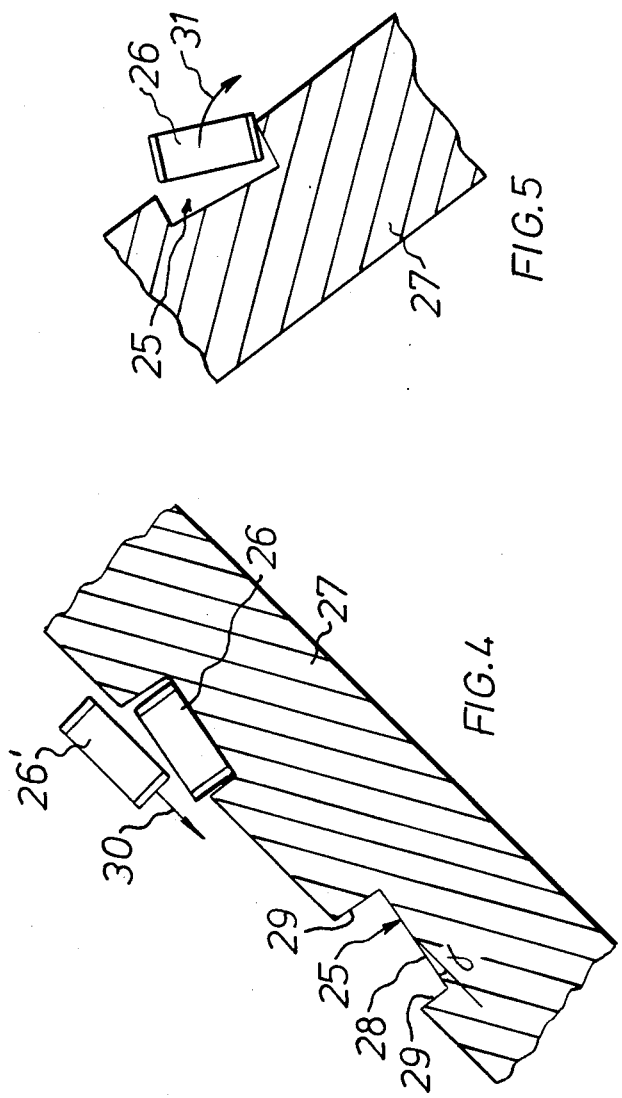

METHOD AND DEVICE FOR MOUNTING ELECTRONIC COMPONENTS ON A PRINTED CIRCUIT CARD

BACKGROUND OF THE INVENTION

For many years, electronic components have been mounted on printed circuit cards or other substrates by pushing their conductor pins through apertures in the printed circuit cards, and after mounting all components, soldering is effected, using the flow soldering method. More recently, electronic components without conductor pins have been produced which are mounted on the conductor path side of the printed circuit card and are temporarily fixed thereto before soldering is effected. There are great advantages in using these pinless electronic components since both sides of the printed circuit card can be used, thus reducing the conductor length. Furthermore, the shorter lead-ins to the electronic components entail better high-frequency properties, and the absence of conductor pins also entails higher quality as a consequence of fewer joints in the connecting chain.

For mounting printed circuit cards, highly automated equipment adapted for long production runs is used, but for short runs or experimental production, manual mounting of the electronic components on the printed circuit cards is required, and in that connection handling of the pinless electronic components and orienting them in relation to the printed circuit cards was found to be both difficult and time-consuming.

It is therefore an object of the present invention to provide a quick method for manually mounting such pinless electronic components on printed circuit cards. Another object is to provide a device for effecting such mounting and for orienting the components in a manner suitable for manual mounting.

SUMMARY OF THE INVENTION

When mounting pinless electronic components on the conductor path side of a printed circuit card, in accordance with the present invention, the components are oriented in a predetermined manner, depending on the desired orientation at the mounting site, in component trays from which the components are transferred to the printed circuit card by means of a manually operated suction device. On the conductor path side of the printed circuit card, an adhesive material is previously applied at the intended mounting sites of the components, the suction force of the suction device being set at a lower value than the adhesive force of the adhesive material.

In addition to a number of component trays, a mounting table with a rotatable holder for the printed circuit cards, a program-controlled indicator system for indicating the relevant trays and mounting sites, and a suction device for manually transferring the components from the trays to the printed circuit card, the device according to the present invention is provided with a surface profiling adapted to facilitate orienting and catching of said components. The device also has a movable wrist support ruler for quick and accurate alignment of the components with respect to the intended mounting sites. A pressure sensing element may be provided in the suction line of the suction device for sensing when a component has been placed on the printed circuit card.

Experiments with the invention have shown that the operator can greatly increase his mounting capacity, for example from about 400 to about 1,500 components an hour when using the method and the device according to the invention.

BRIEF DESCRIPTION OF THE DRAWINGS

An embodiment of the invention will be described in detail below, reference being made to the accompanying drawings in which:

FIG. 3 shows a component tray to be used in the device, having a surface profiling adapted to facilitate catching and orienting of said components;

FIG. 4 shows an example of the design of said surface profiling and how it functions;

FIG. 5 shows the same embodiment as in FIG. 4, but with the tray bottom in a different position;

FIG. 6 shows an alternative embodiment of said surface profiling;

FIG. 7 shows an electronic component being seized by the suction device;

FIG. 8 shows schematically how this electronic component is applied to the conductor path side of a printed circuit card;

FIG. 9 is a cross-section of a printed circuit card with electronic components with and without conductor pins;

DETAILED DESCRIPTION OF THE PREFERRED EMBODIMENTS

Figure 1:
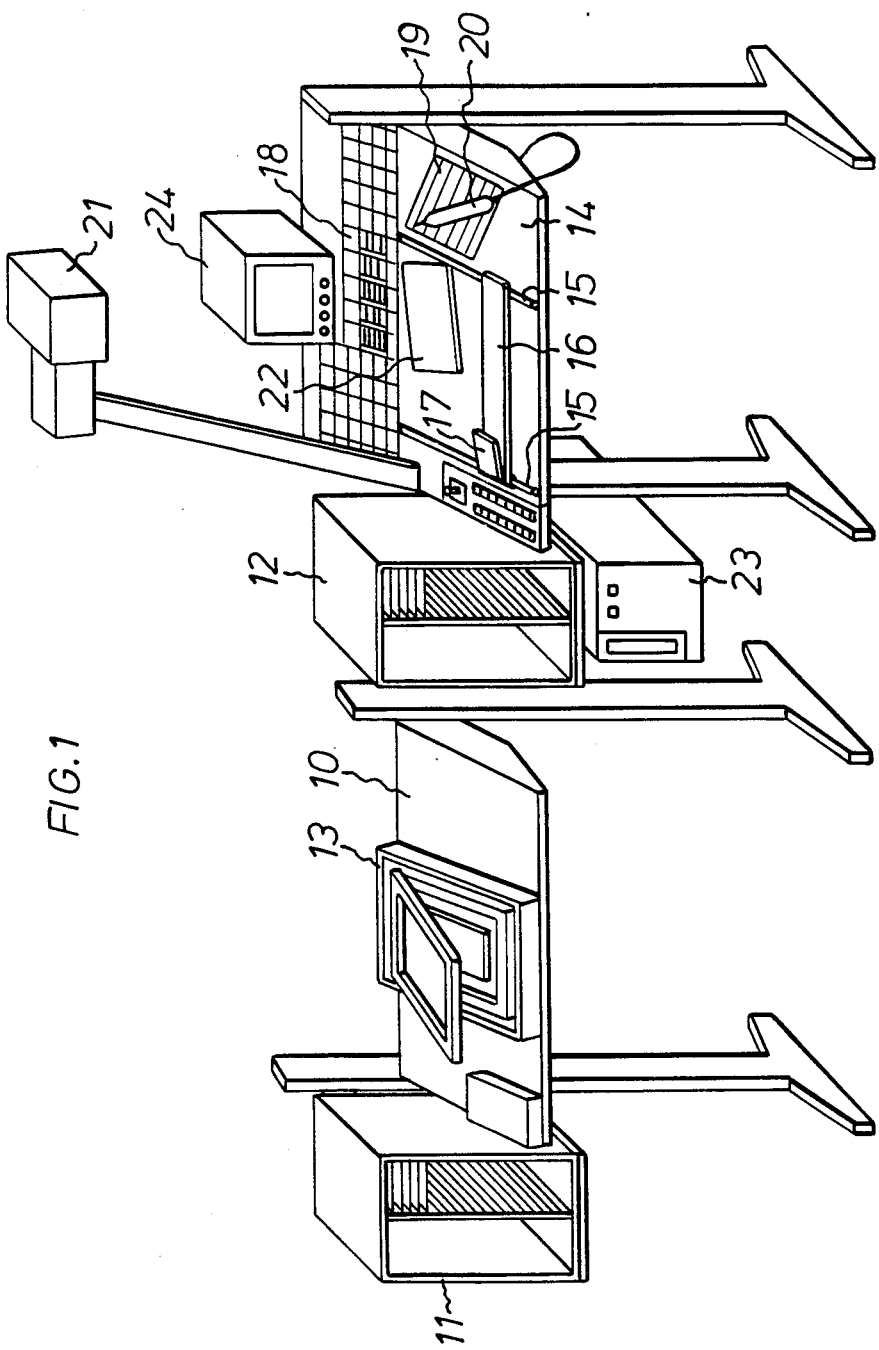
FIG. 1 is a schematic perspective view of a device according to the invention.

FIG. 1 shows an example of a work station which may be used with the present invention. It comprises a worktable 10 and two printed circuit card magazines 11, 12. The worktable 10 supports a screen printing equipment 13 for applying adhesive material to predetermined locations on the printed circuit cards. The work station also comprises a worktable 14, with guides 15, and a wrist support ruler 16 with a control handle 17. The ruler 16 is movable up and down along the guides 15. Above the table there is a series of component trays 18 designed as described below. Furthermore, the work station comprises supply devices 19 for supplying components mounted in advance on tapes. The work station also has a suction device 20 for manually handling various electronic components. The suction device of the invention is connected to a suction pump (not shown). The device also comprises a projector head 21 adapted to project a light indication both on the relevant storage tray 18, 19 and on the corresponding mounting site on a printed circuit card 22. The projection of light indications on the storage trays and the printed circuit card is controlled by a computer 23 having a monitor which gives instructions to the operator. Alternatively, light emitting diodes controlled by the computer may be used to indicate the relevant storage tray 18, 19.

The device according to the present invention includes storage trays 18 with a surface profiling adapted to determine the intended orientation of said components and to catch them. An embodiment of such tray is shown in FIG. 3. This tray 18 is elongated and has a number of transverse grooves 25 for catching the components 26 when they are caused to slide along the tray bottom 27. In this embodiment, the tray also serves as a storage tray and contains a large number of identical components. When not in use, the tray may be covered with a lid.

FIGS. 4 and 5 show a preferred embodiment of the surface profiling of the tray bottom 27 to facilitate orienting and catching of said components. As will be apparent from the Figures, the bottom 28 of the groove forms an angle $\alpha$ with the tray bottom 27 such that the rectangular components 26 when lying in the groove, are tilted in relation to said tray bottom. The side walls 29 of the groove can be either parallel to each other and perpendicular to the groove bottom 28, or, preferably, diverging from each other outwardly from the groove bottom 28.

FIG. 4 shows the position of the bottom when the tray is tilted to fill the grooves with components. The components 26, 26' are then sliding downwards along the bottom 27 in the direction of the arrow 30, this sliding movement being facilitated because the components already in the grooves (component 26) do not stop the following components (component 26') in their downward movement, but instead help them over the groove down into the next groove. It is worth mentioning that the grooves 25, as seen in the direction of the arrow 30, are only somewhat wider than the short dimension of the rectangular components. Thus, the longitudinal direction of the components must coincide with the longitudinal direction of the grooves to enable the components to fall down into the grooves. To indicate which side of the components is turned upwards, the major sides of the components may have different colors, as is customary.

The components are removed from the grooves at intervals to avoid a situation wherein all components left in the grooves are turned in the wrong direction. This is effected by tilting the trays in the opposite direction, as illustrated by FIG. 5, the tilting being made sharply to facilitate the falling out of the components in the direction of the arrow 31.

FIG. 6 shows grooves 32 of different design, to be used for example when mounting cylindrical components 33. In this case the tip 34 of the suction device may be given a design corresponding to the circumference of the components to improve the grasping effect.

FIG. 7 shows how a component 26 can be lifted out of its groove by means of the tip 35 of the suction device 20.

FIG. 8 shows the mounting of components on the conductor path side of a printed circuit card 22. Thus, the card has conductor paths 36 designed in conventional manner. By means of the screen printing equipment 13 shown in FIG. 1, adhesive spots or lines 37 have been applied in advance to the sites where the components 26 are to be mounted. Use is preferably made of an adhesive material which has a higher adhesive force than the suction force holding the components 26 to the tip 35 of the suction device 20. This is a great advantage since the operator receives a strong indication as to whether or not he has succeeded in mounting the component on the intended site. Thus, if there is no adhesive material 37 on the site where the component is to be mounted, it will not adhere, nor will it come off the tip 35 of the suction device. Furthermore, a sudden increase of pressure arises in the suction lines to the suction device when the suction force of the suction device is exceeded by the adhesive force of the adhesive material 37 when mounting the component. This sudden increase of pressure may be indicated by means of a pressure-sensing element (not shown) in the suction line. The signal sensed by the pressure-sensing element may be used to control the equipment so that the indexing, determined by the computer program, to the next assembly step can be interrupted if one did not manage to fix the component to the printed circuit card. The adhesive material used for this purpose must be a glue which adheres at the mounting temperature and which is particularly capable of resisting the high temperatures of the subsequent soldering operation.

After assembly, the printed circuit card is soldered by the conventional wave soldering method. A portion of the printed circuit card, produced in accordance with the invention, may have the appearance as shown in FIG. 9 where components 26 without conductor pins and components 38 with conductor pins are clearly seen. As a result of the soldering, inclined pads 39 of soldering tin connect the conductor paths 36 and the conductor pins 40 of the components 38, and connect the conductor paths 36 and the connection surfaces 41 of the pinless components 26, respectively.

Figure 2:
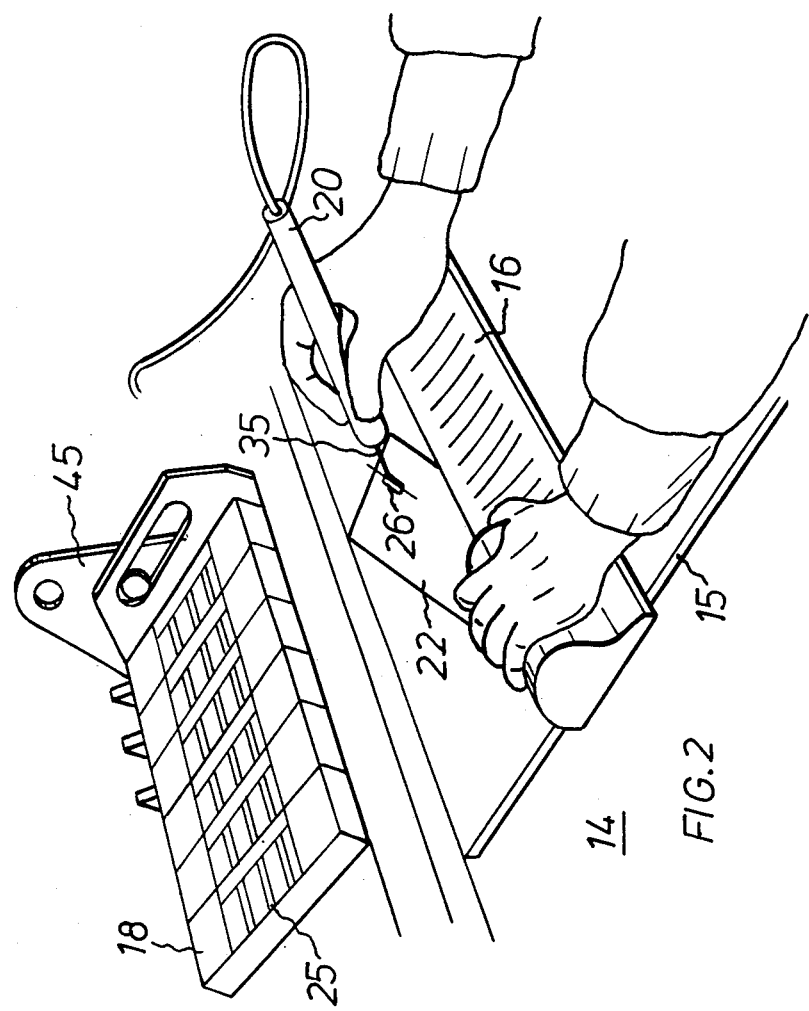
FIG. 2 is a perspective view of a part of this device.
Figure 10:
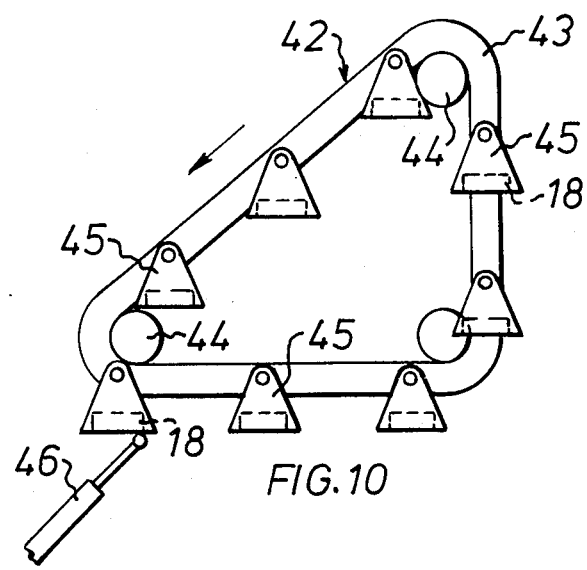
FIG. 10 shows schematically a conveyor for groups of trays in the device according to the invention.
Figures 11, 12, 13, 14, 15:
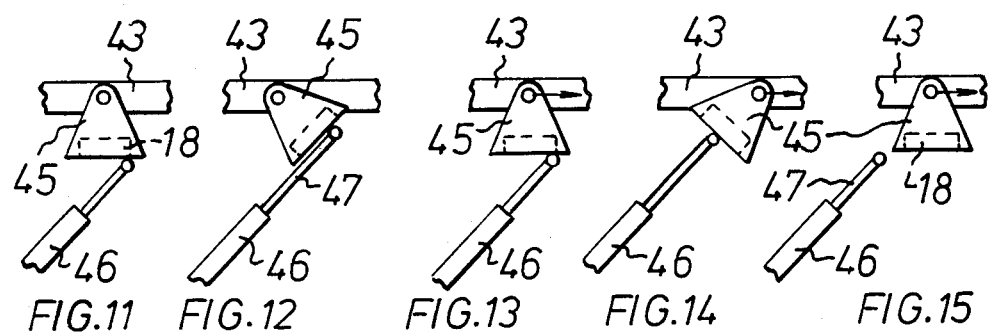
FIGS. 11–15 show schematically various operating steps for tilting the trays.

FIGS. 10–15 show a conveyor to be utilised for handling single component trays or groups of component trays in the device according to the invention. This conveyor 42 comprises a chain 43 running over guide rollers 44, one of which is a driving roller. A number of cradles 45 are suspended from the chain at regular intervals. The cradles 45 carry one or more trays 18 to a location within reach of the operator. The movements of the chain conveyor are controlled by the computer 23 which synchronises them with the other assembly operations. The equipment may have a piston and cylinder unit 46 engaging with the bottom side of the cradles, as shown in FIG. 10 to achieve tilting of the component trays 18 before removing the components therefrom. When the chain conveyor 42 has stopped and taken its correct position of alignment, the piston and cylinder unit is extended in the manner appearing on comparison of FIGS. 11 and 12. Thus, the piston 47 of the unit will tilt the cradle 45 and the trays 18 carried thereby, making the trays form a suitable angle to the base, for example 45°. At the same time, the trays are within easy reach of the operator, as shown in FIG. 2. When the relevant components have been mounted and the conveyor is to advance a new cradle with trays 18, the piston 47 is partially retracted into the cylinder 46, as shown in FIG. 13. Just before the cradle 45 leaves the tip of the piston and cylinder unit, this is slightly extended, as shown in FIG. 14. Now the cradle is tilted clockwise, which makes the tray bottoms take the position shown in FIG. 5, and the components are released from their grooves 25. The cradle should be tilted with a sharp jerk to ensure that the components are in fact released from their grooves. When the conveyor next brings the same cradle 45 and its inserted trays back to the correct position of alignment, the operating sequence is repeated.

As mentioned above, the mounting table 14 has holders for the printed circuit cards 22. These holders of fixtures are preferably arranged on a rotatable portion of the table 14, the relevant angular position being detected by means of an angle detector and being fed to the computer 23 to correct the co-ordinate system to correspond to the alignment chosen for the printed circuit card. This enables the operator to turn the printed circuit card 22 in the manner shown, if the longitudinal direction of the components to be mounted is to extend in the longitudinal direction of the card. If, on the other hand, the components are to extend transversely of the card, the rotatable fixture table can be released and reset in a new desired position, for example 90° relative to the position shown. Thus, the operator has considerable freedom of choice in ergonomically adapting his work station to his own preferred working position. The wrist support ruler 16 contributes to the increased comfort and, furthermore, to a higher degree of accuracy. The pinless electronic components are relatively small, for example 2.0×1.25 mm or 4.5×3.2 mm, which makes it difficult accurately to place them in the intended site. The degree of accuracy should be fractions of one millimeter.

As already mentioned, the application of glue is one of the biggest problems since the glue spray guns available do not work accurately enough if short series are to be produced. Therefore, the screen printing technique is highly advantageous for applying the adhesive material. A screen can be made of a plastic board with apertures at the sites where the components are to be mounted.

What is claimed is:

1. A method for mounting electronic components without connector pins and having a dimension in one axial direction larger than in a second axial direction onto a substrate having adhesive thereon at mounting sites for said components, said method comprising the steps of:

providing storage tray means for storing said components prior to mounting said components onto said substrate, a surface of said storage tray means having grooves therein adapted to receive said components in a predetermined orientation, said grooves being narrower in width than the larger axial dimension of said components;

sliding said components across the surface of said storage tray means in a direction transverse to said grooves, whereby said components are received in and oriented in said grooves;

providing a suction means having sufficient suction force to lift said components;

removing said oriented components from said storage tray means by said suction means and transferring said components to said adhesive on said substrate; and said suction force produced by said suction means being less than are attractive force of said adhesive on said substrate.

2. An apparatus for mounting electronic components without connector pins and having a first dimension in one axial direction larger than a second dimension in a second axial direction onto a substrate having adhesive thereon at predetermined mounting sites for said components, said apparatus comprising:

table means for supporting said substrate thereon;

tray means adjacent the table means for holding said components, said tray means being pivotable relative to the table means about an axis of rotation and having a surface with grooves therein parallel to said axis of rotation, said grooves being narrower in width than said first dimension and larger than said second dimension and being adapted to receive said components in alignment with the grooves;

suction means operatively associated with said table means for lifting said components from said tray means and transferring the components to the substrate, the suction means being movable between the tray means and the table means;

indicator means operatively associated with the table means and the tray means, the indicator means being operable to indicate a corresponding pair of said grooves and said mounting sites, whereby components are identified to be lifted from said tray means to specific identified mounting sites on said substrate; and, driving means operatively associated with said tray means for pivoting said tray means about said axis of rotation, whereby pivoting said tray means about said axis of rotation causes said components on said tray means to slide across said tray means in a direction transverse to said grooves, the components being received in the grooves.

3. An apparatus as claimed in claim 2, wherein bottom surfaces of said grooves in said tray means are angled and side walls of said grooves are substantially perpendicular to the bottom surfaces of said grooves.

4. An apparatus as claimed in claim 2, wherein said table means comprises:

a wrist support ruler;

guide means operatively connected to said wrist support ruler for moving said ruler therealong;

control means attached to said ruler for positioning said ruler along said guide means; and surface means adjacent said guide means for receiving said substrate and adjusting a directional orientation of said substrate.

5. A device as claimed in claim 4, further comprising:

switch means actuating said indicator means to identify a next corresponding pair of said grooves and said mounting sites.

6. A device as claimed in claim 5, wherein the switch means are responsive to a pressure sensing means connected to said suction means for actuating said indicator means in response to variations in pressure in said suction means.

7. An apparatus as claimed in claim 2, wherein successive tray means are movable to the table means for mounting components on successive substrates, and further comprising conveyor means positioned adjacent said table means for supplying at least one additional tray means to a position adjacent said table means for successive mounting operations.

8. An apparatus as claimed in claim 2, wherein the bottom surface of said grooves in said tray means are angled, and the side walls of said grooves diverge outwardly from the bottom surfaces.

* * * * *